(12) United States Patent
Chaoua

(10) Patent No.: US 9,496,894 B1
(45) Date of Patent: Nov. 15, 2016

(54) SYSTEM AND METHOD FOR DATA COMPRESSION OVER A COMMUNICATION NETWORK

(71) Applicant: GE LIGHTING SOLUTIONS, LLC, East Cleveland, OH (US)

(72) Inventor: Youcef Chaoua, Montreal (CA)

(73) Assignee: GE LIGHTING SOLUTIONS, LLC, East Cleveland, OH (US)

( * ) Notice: Subject to any disclaimer, the term of this patent is extended or adjusted under 35 U.S.C. 154(b) by 0 days.

(21) Appl. No.: 14/919,042

(22) Filed: Oct. 21, 2015

(51) Int. Cl.
    *H03M 7/38* (2006.01)
    *H03M 7/30* (2006.01)
    *H04L 29/06* (2006.01)

(52) U.S. Cl.
    CPC ............ *H03M 7/3088* (2013.01); *H04L 69/04* (2013.01)

(58) Field of Classification Search
    CPC ... H03M 7/3088; H03M 7/3002; H04L 9/04; H04L 1/003
    USPC .............................. 341/50, 51, 65, 67, 76, 77
    See application file for complete search history.

(56) References Cited

U.S. PATENT DOCUMENTS

| | | | | |
|---|---|---|---|---|
| 6,195,024 | B1 * | 2/2001 | Fallon | G06T 9/00 341/51 |
| 8,428,140 | B2 * | 4/2013 | Amon | H04N 19/70 348/445 |
| 2015/0242122 | A1 * | 8/2015 | Yeh | G06F 3/061 711/103 |

\* cited by examiner

*Primary Examiner* — Peguy Jean Pierre
(74) *Attorney, Agent, or Firm* — GE Global Patent Operation; Peter T. DiMauro

(57) ABSTRACT

A method for data compression includes reading first data representing sensor data capture, compressing the data with a lossless algorithm, transmitting the compressed data as a reference frame, reading subsequent data, calculating a delta between the first data and the subsequent data, compressing the data delta, and determining if the compression ratio of the compressed data delta is within a predetermined tolerance threshold. If the compression ratio is within the threshold, transmitting the compressed data delta frame, and repeating the calculating, compressing, and determining steps for subsequent data; Else if the compression ratio is not within the threshold, compressing the current subsequent data and transmitting the result as an updated reference frame. Then repeating the calculating, compressing, and determining steps for subsequent data. A system and a non-transitory computer-readable medium for implementing the method are also disclosed.

20 Claims, 3 Drawing Sheets

SYSTEM AND METHOD FOR DATA COMPRESSION OVER A COMMUNICATION NETWORK

BACKGROUND

Municipalities face challenges from growth that brings more people, vehicles, and events. City planners are already updating infrastructure to build more robust systems designed to incorporate features possible with new technology. For example, technology makes possible wireless remote control, and monitoring of street and roadway lights.

Video monitors can provide information on traffic patterns to a central management system. This information can be used to control traffic lights to adjust the traffic flow. Also, information on optimum routes and parking information can be uploaded to smart-enabled vehicles. Information obtained from weather sensors could prepare drainage systems for flooding. Motion detectors could interface with streetlights to deter criminals. Solar sensors could communicate with a network of smart buildings to coordinate power and energy usage. Chemical, biohazard, and ionized radiation detectors can monitor and analyze air quality.

By embedding sensors into street lights and installing these additional devices, a significant amount of data can be collected. All this data needs to be communicated across a communication network to a centralized data repository, where the data can be analyzed and utilized. This communication network can also have a need to efficiently download data and/or provide control commands to the sensor devices.

With an enormous amount of sensors collecting data, the communication network bandwidth can be seriously compromised without a robust data compression scheme.

DETAILED DESCRIPTION

In accordance with embodiments, systems and methods provide a data transmission compression scheme that includes a reference frame (i.e., a packet or structure) followed by a variable amount of data delta frames, where the amount of data delta frames between reference frames is actively selected by the transmitting node. In accordance with implementations, the transmitting node can determine whether a reference frame is needed by comparing the compression ratio of a current data delta frame to a predetermined, selectable compression ratio threshold. The transmitting node can then generate a new reference frame. In certain embodiments, an explicit request from a backend server (and/or a receiver) can request a new reference frame be transmitted.

Figure 1:
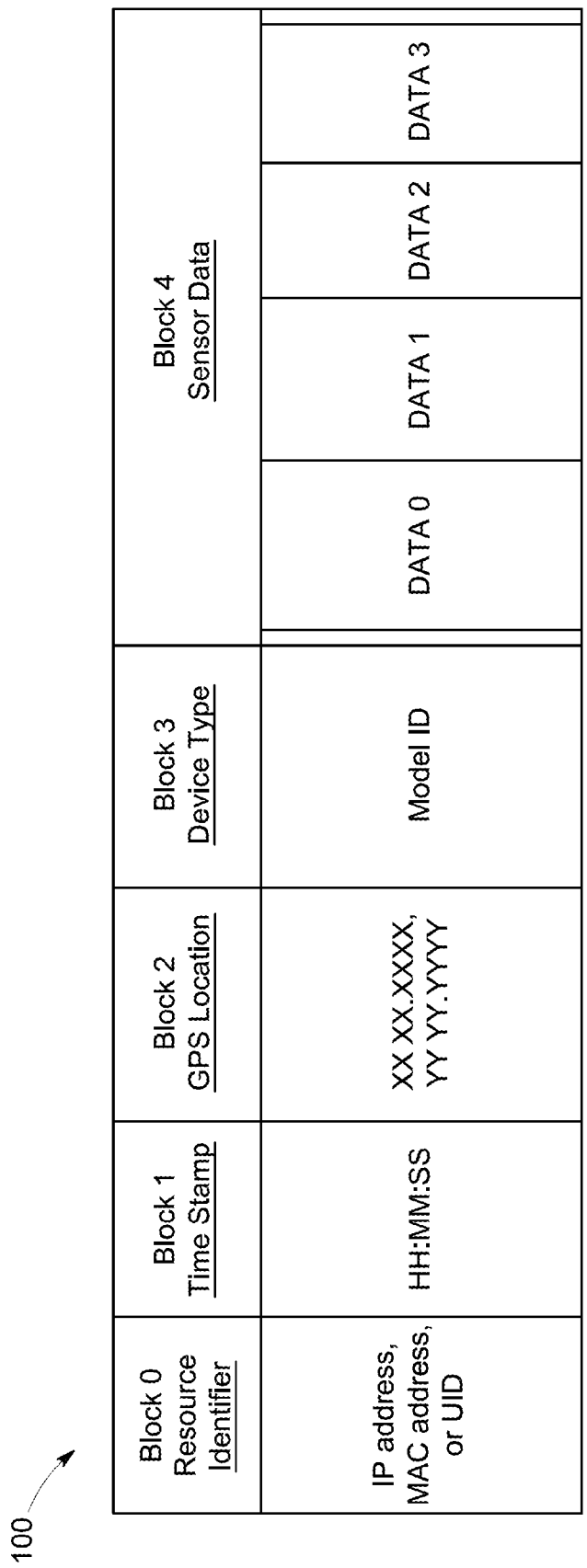
FIG. 1 depicts a representative data capture of a smart sensor.

FIG. 1 depicts data capture 100 that is representative of the data format and nature that a municipal sensor can capture. Embodying compression systems and methods are not limited to the data format and nature of the data capture. Data capture 100 is presented merely for purposes of discussion. Exemplary data capture 100 has five blocks of data (Block 0, Block 1, Block 2, Block 3, and Block 4). Certain of these data blocks could be invariant over time—for example, resource identifier Block 0, model identification Block 3, and GPS location Block 2. Time stamp Block 1 can change to reflect the time that sensor data was captured by the device. Sensor data Block 4 can also change based on the monitored data. Sensor data Block 4 is depicted as having four blocks of data for purposes of illustration only. It should be readily understood that the amount of data gathered by a sensor is dependent on the sensor and the nature of the data being gathered.

For example, a weather sensor can capture temperature, humidity, air pressure, and wind speed data. Other sensors, for instance a chemical sensor, might have only one block of sensor data. The sensor can provide its data capture to a web application running on a remote server. However, bandwidth requirements for the data transfer can be reduced by not sending the invariant data of Block 0, Block 2 and Block 3 with each transmitted data package frame.

Figure 2:
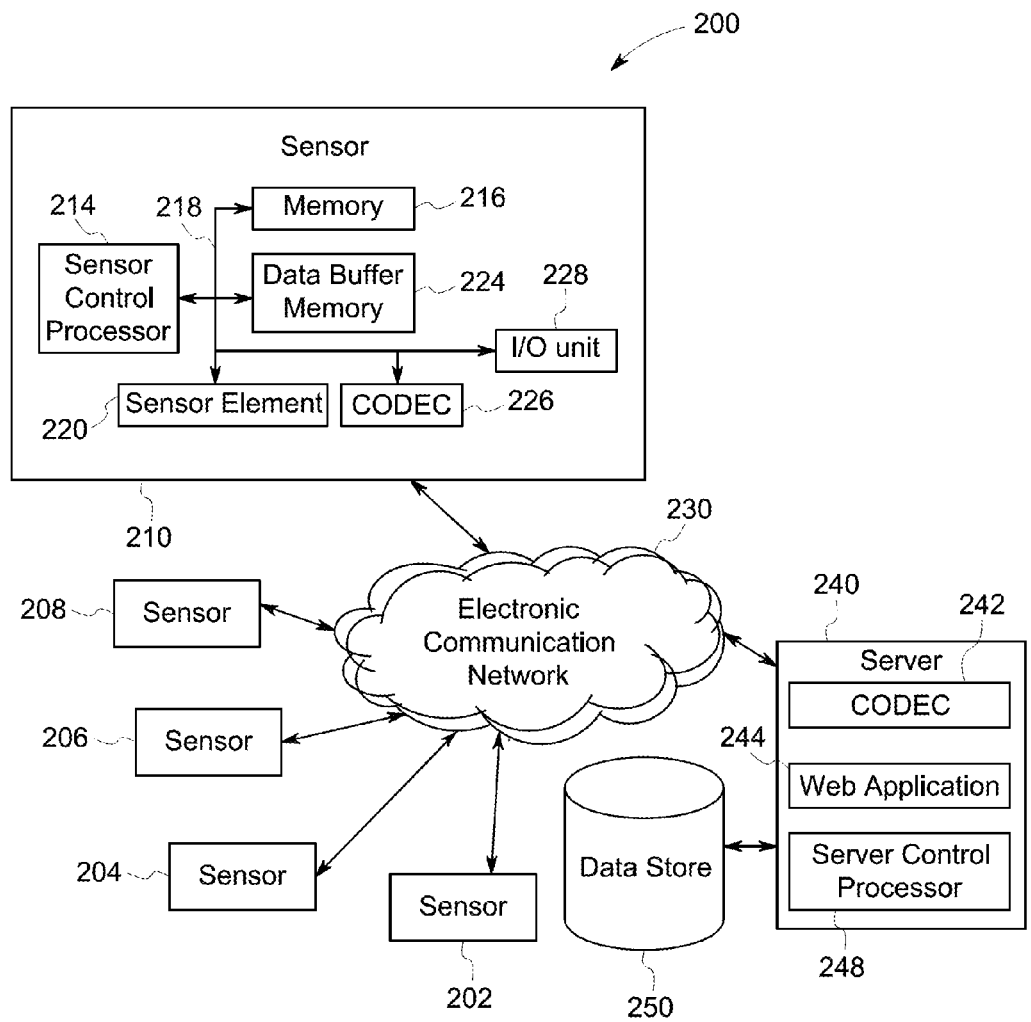
FIG. 2 depicts a system for implementing data compression in accordance with embodiments.

FIG. 2 depicts system 200 for implementing a data compression scheme in accordance with embodiments. System 200 includes sensor units 202, 204, 206, 208, 210, which monitor conditions, activities and/or status local to their physical position. A non-exhaustive list of monitored conditions and/or activities can include ambient light conditions, traffic congestion, parking availability, pedestrian flow, weather, and environmental conditions. For purposes of illustration, system 200 is depicted as having five sensor units. It should be readily understood that embodying systems and methods are not so limited.

Each sensor unit can include sensor control processor 214, which controls the operation of the sensor unit by executing computer instructions that can be stored in memory 216. Sensor control processor 214 can communicate with other components of the sensor unit across internal bus 218. The control processor can control the operation of sensor element 220. The sensor element collects, monitors, and/or acquires data on the monitored condition and/or activity particular to that sensor unit. The data collected by the sensor element can be stored in data buffer memory 224. This data can be stored in a format as represented by data capture 100. In accordance with embodiments, data capture 100 need not be a one-dimensional matrix as depicted in FIG. 1. Rather, data capture 100 can be multi-dimensional, where each dimension can represent a snapshot of data obtained by sensor element 220. In some implementations data buffer memory 224 and memory 216 need not be separate memory units.

Coder/decoder (Codec) 226 can encode (compress) data capture 100 in accordance with embodying compression methods disclosed below. The sensor unit can include input/output (I/O) unit 228 that communicates with server 240 across electronic communication network 230. In some implementations, where server 240 provides data and/or control signals to the sensor unit, codec 226 can decode (decompress) the server signal. For secure transmission, codec 226 can also implement encryption algorithms and techniques.

Electronic communication network 230 can be implemented as a mesh network, a personal area network (PAN), the Internet, and/or any other communication network. Municipal sensor units are popularly linked to form a mesh network, or a low power PAN, where nodes of electronic communication network 230 are the sensor units themselves. The sensor units act as nodes relaying the data packets across the network. One low power PAN is designated as 6loWPAN, which implements IPv6 over a low power, wireless PAN. 6loWPAN provides Internet protocol networking capability to low-power devices with limited processing power. The bandwidth of electronic communication network 230 is constrained greatly by the limited processing power, and low bandwidth capabilities of the sensor units. Accordingly, embodying compression techniques make it possible for the networking of the multitude sensor units typically present in a municipal network.

Server 240 can include a codec 242 to decompress data received across the electronic communication network. This data can be stored in data records within data store 250. Web application (WebApp) 244 can access data received from the sensor unit(s). Server control processor 248 can control the operation of server 240, its components, and the web application by executing computer instructions stored in memory.

Figure 3:
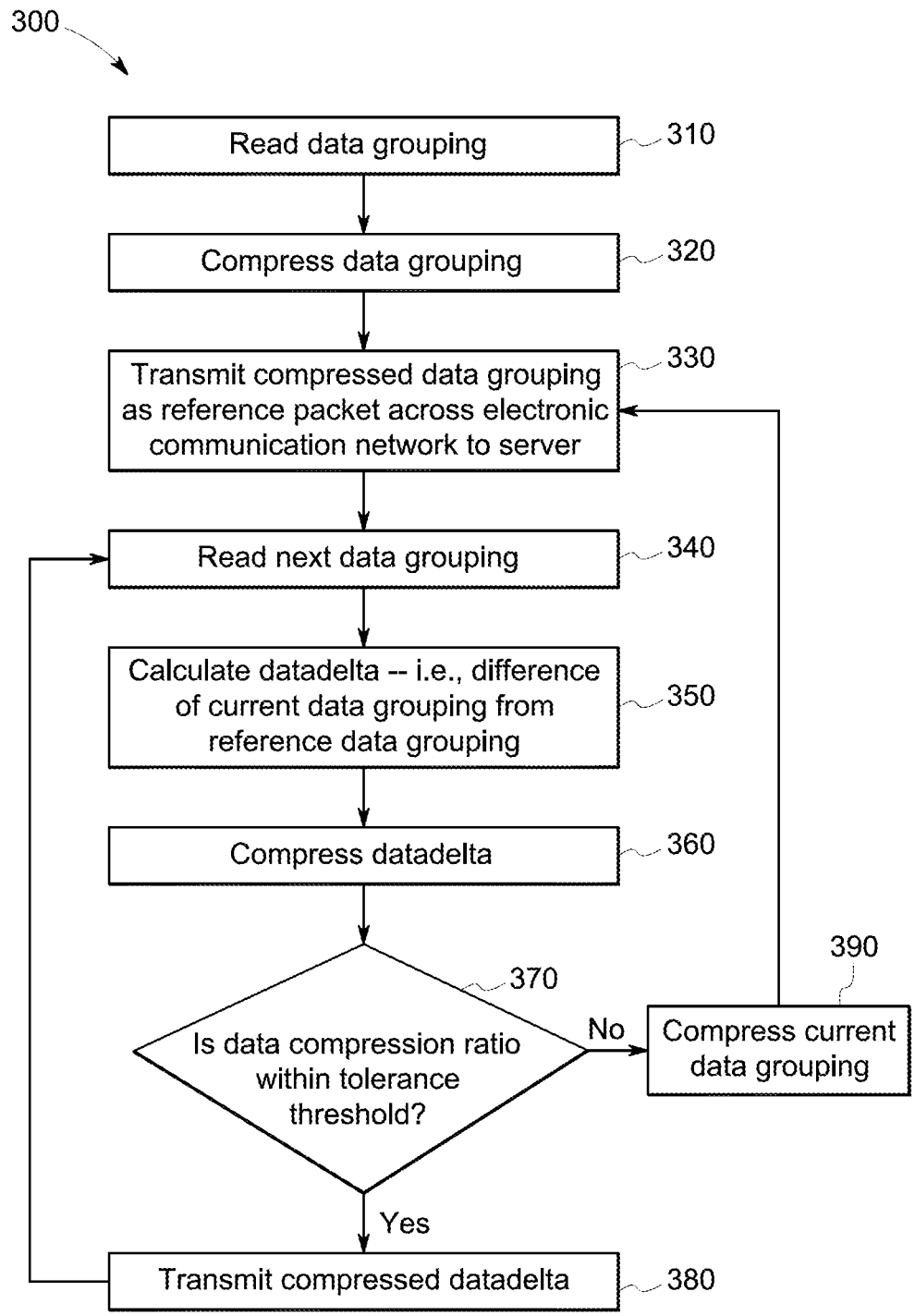
FIG. 3 depicts a process for data compression in accordance with embodiments.

FIG. 3 depicts process 300 for data compression in accordance with embodiments. The codec can read, step 310, a data grouping from buffer memory. The data grouping can be formatted as a single dimensional array of data, such as data capture 100 (FIG. 1). In other implementations, the data grouping can be one dimension of a multi-dimensional data array, where each dimension is data capture 100.

The first data grouping read from memory is compressed, step 320. The compression algorithm can be a lossless compression so that the reconstructed data is as close to the original data as possible. For example, the data compression can be implemented as Lempel-Ziv-Welch (LZW) data compression. The compressed data is transmitted, step 330, across the electronic communication network to the server. This first data grouping is used as a reference frame for subsequent groupings.

Steps 340-390 form a loop a disclosed below. The loop terminates when the last data grouping is read from a multi-dimensional array. For implementations that compress a single dimensional data grouping, subsequent data captures are read in this loop and compressed as disclosed below. In single dimensional implementations the loop can terminate after expiration of a predetermined time period where the reference data can be considered stale. In accordance with embodiments, the compression can terminate if the compression ratio is outside a predetermined threshold; after a predetermined number of transmitted delta frames; on power reset by the server, the transmitting node, or the electronic communication network; and on explicit request from the server (and/or receiver). In some implementations, if the delta frame has no difference from the previous transmitted frame (i.e., the delta frame is all zero(es)), the zero delta frame can be optionally transmitted, or not transmitted.

A subsequent data grouping is read, step 340, by the codec. A delta between the current data grouping read at step 350 and the reference frame is determined by subtracting the reference frame from the current data grouping. The data delta is compressed, step 360, using the lossless compression algorithm.

A determination is made, step 370, as to whether the compression ratio of the current data delta is within a predetermined tolerance threshold. This predetermined threshold can be selected by system designers based on bandwidth efficiency, or other, considerations. If the compression ratio is within tolerance, the compressed data delta is transmitted, step 370, to the server. Process 300 continues at step 340 where the next data grouping is read by the codec.

If at step 370 the determination is made that the compression ratio of the current data delta is not within the predetermined tolerance threshold, the current data grouping is compressed by the codec, step 390. Process 300 returns to step 330, where this compressed current data grouping is transmitted as an updated reference for subsequent data groupings.

Embodying systems and methods transmit a reference frame followed by several data delta frames. Each transmitted frame is compressed using a lossless technique, for example, LZW lossless compression algorithm. For specific data sets, the LZW compression is estimated to achieve a compression ratio of about 50% for the reference frames, and a compression ratio of about more than 70% for the data delta frames. It should be readily understood that these compression ratios can vary by the content and nature of the data undergoing the compression technique.

In accordance with an embodiment, the server can transmit an acknowledgment for each received frame. Delta frames are associated with references frames. In accordance with embodiments, for each delta there is an associated reference frame. The server needs to know what reference was applied to obtain the delta in order to be able to decode its data. For example, if the server just rebooted and starts receiving delta frames, they are of no use until the server receives the reference frame from which the deltas were obtained. In case of a missing data delta frame, the server will not be lost as soon as it receives a new delta or reference frame. If an acknowledgement is not received for a reference frame transmission, the server will need to receive at least another reference frame from the codec in order to achieve a decompression ratio within tolerance for any subsequent data delta frames.

In accordance with embodiments, Numbering the reference data frame and their delta frames can improve the robustness of this compression scheme. By way of example, reference frames can be numbered from 0 to 255, delta frames generated by the reference frame can be numbered from 0 to 255. The transmitted delta packet can include in its header information both the reference frame number, and the delta frame number for this transmitted delta packet. Including both numbers in the packet header can be used by the server (and/or receiver) to track proper decompression. If the server just joined the network (e.g., after a reboot), this numbering scheme can inform the server as to which reference packet(s) are needed for decompression.

The codec can implement an embodying compression technique on a matrices of data, where a first matrix of reference data is represented as $D_{i,j}$ as depicted in

TABLE 1

First data element

| | | | | |
|---|---|---|---|---|
| $D_{(0,0)}$ | $D_{(0,1)}$ | $D_{(0,2)}$ | $D_{(0,3)}$ | $D_{(0,4)}$ |
| $D_{(1,0)}$ | $D_{(1,1)}$ | $D_{(1,2)}$ | $D_{(1,3)}$ | $D_{(1,4)}$ |
| $D_{(2,0)}$ | $D_{(2,1)}$ | $D_{(2,2)}$ | $D_{(2,3)}$ | $D_{(2,4)}$ |
| $D_{(3,0)}$ | $D_{(3,1)}$ | $D_{(3,2)}$ | $D_{(3,3)}$ | $D_{(2,4)}$ |
| $D_{(4,0)}$ | $D_{(4,1)}$ | $D_{(4,2)}$ | $D_{(4,3)}$ | $D_{(3,4)}$ |
| $D_{(5,0)}$ | $D_{(5,1)}$ | $D_{(5,2)}$ | $D_{(5,3)}$ | $D_{(4,4)}$ |
| $D_{(6,0)}$ | $D_{(6,1)}$ | $D_{(6,2)}$ | $D_{(6,3)}$ | $D_{(5,4)}$ |

The first read data element $D_{i,j}$ is sent as a reference frame after lossless compression is applied by the codec. Subsequent data elements ($d_{i,j}$) in corresponding matrix positions (Table 2), are read by the codec.

TABLE 2

Current Data Element

| $d_{(0,0)}$ | $d_{(0,1)}$ | $d_{(0,2)}$ | $d_{(0,3)}$ | $d_{(0,4)}$ |
|---|---|---|---|---|
| $d_{(1,0)}$ | $d_{(1,1)}$ | $d_{(1,2)}$ | $d_{(1,3)}$ | $d_{(1,4)}$ |
| $d_{(2,0)}$ | $d_{(2,1)}$ | $d_{(2,2)}$ | $d_{(2,3)}$ | $d_{(2,4)}$ |
| $d_{(3,0)}$ | $d_{(3,1)}$ | $d_{(3,2)}$ | $d_{(3,3)}$ | $d_{(2,4)}$ |
| $d_{(4,0)}$ | $d_{(4,1)}$ | $d_{(4,2)}$ | $d_{(4,3)}$ | $d_{(3,4)}$ |
| $d_{(5,0)}$ | $d_{(5,1)}$ | $d_{(5,2)}$ | $d_{(5,3)}$ | $d_{(4,4)}$ |
| $d_{(6,0)}$ | $d_{(6,1)}$ | $d_{(6,2)}$ | $d_{(6,3)}$ | $d_{(5,4)}$ |

Differences between the reference frame $D_{i,j}$ and the subsequent, current data element $d_{i,j}$ is calculated by the codec to yield a data delta $\delta_{i,j}$ (Table 3), which is compressed and sent to the server. It is this $\delta_{i,j}$ that has its compression ratio compared to a predetermined threshold to determine if the compression efficiency is within an acceptable tolerance.

TABLE 3

Data Delta Element

| $\delta_{(0,0)}$ | $\delta_{(0,1)}$ | $\delta_{(0,2)}$ | $\delta_{(0,3)}$ | $\delta_{(0,4)}$ |
|---|---|---|---|---|
| $\delta_{(1,0)}$ | $\delta_{(1,1)}$ | $\delta_{(1,2)}$ | $\delta_{(1,3)}$ | $\delta_{(1,4)}$ |
| $\delta_{(2,0)}$ | $\delta_{(2,1)}$ | $\delta_{(2,2)}$ | $\delta_{(2,3)}$ | $\delta_{(2,4)}$ |
| $\delta_{(3,0)}$ | $\delta_{(3,1)}$ | $\delta_{(3,2)}$ | $\delta_{(3,3)}$ | $\delta_{(2,4)}$ |
| $\delta_{(4,0)}$ | $\delta_{(4,1)}$ | $\delta_{(4,2)}$ | $\delta_{(4,3)}$ | $\delta_{(3,4)}$ |
| $\delta_{(5,0)}$ | $\delta_{(5,1)}$ | $\delta_{(5,2)}$ | $\delta_{(5,3)}$ | $\delta_{(4,4)}$ |
| $\delta_{(6,0)}$ | $\delta_{(6,1)}$ | $\delta_{(6,2)}$ | $\delta_{(6,3)}$ | $\delta_{(5,4)}$ |

In accordance with some embodiments, a computer program application stored in non-volatile memory, computer-readable medium (e.g., register memory, processor cache, RAM, ROM, hard drive, flash memory, CD ROM, magnetic media, etc.), and/or external memory may include code or executable instructions that when executed may instruct and/or cause a controller or processor to perform methods discussed herein including a data compression technique that transmits a variable amount of data delta frames based on a determination as to whether the compression ratio of the data delta frame is within a predetermined threshold, as described above.

The computer-readable medium may be a non-transitory computer-readable media including all forms and types of memory and all computer-readable media except for a transitory, propagating signal. In one implementation, the non-volatile memory or computer-readable medium may be external memory.

Although specific hardware and methods have been described herein, note that any number of other configurations may be provided in accordance with embodiments of the invention. Thus, while there have been shown, described, and pointed out fundamental novel features of the invention, it will be understood that various omissions, substitutions, and changes in the form and details of the illustrated embodiments, and in their operation, may be made by those skilled in the art without departing from the spirit and scope of the invention. Substitutions of elements from one embodiment to another are also fully intended and contemplated. The invention is defined solely with regard to the claims appended hereto, and equivalents of the recitations therein.

The invention claimed is:

1. A method for data compression, the method comprising:
    a coder/decoder (codec) reading a first data group from a memory, the first data group representing sensor data capture by a sensor among a plurality of sensors;
    the codec compressing the first data group with a lossless compression algorithm;
    transmitting the compressed first data group as a reference frame across an electronic communication network to a server;
    reading a first subsequent data group from the memory;
    calculating a data delta between the first data group and the first subsequent data group;
    the codec compressing the data delta;
    determining if a compression ratio of the compressed data delta is within a predetermined tolerance threshold,
    if the compression ratio is within the predetermined tolerance threshold, transmitting the compressed data delta as a delta data frame across the electronic communication network to the server;
    reading a second subsequent data group from the memory; and
    repeating the calculating, compressing, and determining steps for the second subsequent data group.

2. The method of claim 1, including:
    if the compression ratio is not within the predetermined tolerance threshold, compressing the first subsequent data group;
    transmitting the compressed first subsequent data group as an updated reference frame across the electronic communication network to the server;
    reading a second subsequent data group from the memory; and
    repeating the calculating, compressing, and determining steps for the second subsequent data group.

3. The method of claim 1, including linking at least a portion of the plurality of sensors as nodes to form the electronic communication network.

4. The method of claim 1, including formatted the data grouping as a single dimensional array.

5. The method of claim 1, including formatting the data grouping as a multi-dimensional array, where each dimension represents a subsequent sensor data capture.

6. The method of claim 1, including terminating the method when a data grouping is a last data group of a multi-dimensional array.

7. The method of claim 1, including terminating the method after expiration of a predetermined time period.

8. The method of claim 1, including transmitting a variable amount of data delta frames following transmitting the reference frame.

9. A non-transitory computer readable medium having stored thereon instructions which when executed by a processor cause the processor to perform a method of data compression, the method comprising:
    reading a first data group from a memory, the first data group representing sensor data capture by a sensor among a plurality of sensors;
    compressing the first data group with a lossless compression algorithm;
    transmitting the compressed first data group as a reference frame across an electronic communication network to a server;
    reading a first subsequent data group from the memory;
    calculating a data delta between the first data group and the first subsequent data group;
    compressing the data delta;
    determining if a compression ratio of the compressed data delta is within a predetermined tolerance threshold,
    if the compression ratio is within the predetermined tolerance threshold, transmitting the compressed data delta as a delta data frame across the electronic communication network to the server;
reading a second subsequent data group from the memory; and
repeating the calculating, compressing, and determining steps for the second subsequent data group.

10. The non-transitory computer readable medium of claim 9, including instructions that cause the processor to:
if the compression ratio is not within the predetermined tolerance threshold, compress the first subsequent data group;
transmit the compressed first subsequent data group as an updated reference frame across the electronic communication network to the server;
read a second subsequent data group from the memory; and
repeat the calculating, compressing, and determining steps for the second subsequent data group.

11. The non-transitory computer readable medium of claim 9, including instructions that cause the processor to link at least a portion of the plurality of sensors as nodes to form the electronic communication network.

12. The non-transitory computer readable medium of claim 9, including instructions that cause the processor to format the data grouping as a single dimensional array.

13. The non-transitory computer readable medium of claim 9, including instructions that cause the processor to format the data grouping as a multi-dimensional array, where each dimension represents a subsequent sensor data capture.

14. The non-transitory computer readable medium of claim 9, including instructions that cause the processor to terminate the method when a data grouping is a last data group of a multi-dimensional array.

15. The non-transitory computer readable medium of claim 9, including instructions that cause the processor to terminate the method after expiration of a predetermined time period.

16. The non-transitory computer readable medium of claim 9, including instructions that cause the processor to transmit a variable amount of data delta frames following transmitting the reference frame.

17. A system for data compression, the system comprising:
at least one sensor unit having a sensor element, the sensor element configured to monitor a condition, activity, or status local to its location;
the sensor connected to a server across an electronic communication network;
the sensor unit including a control processor in communication with one or more memory units in the sensor, the sensor element, a coder/decoder (codec), and a memory unit;
the codec configured to read sensor data from the memory unit and compress the sensor data with a compression algorithm under control of the control processor;
the compression algorithm including:
calculating a data delta between a first data group and a first subsequent data group;
compressing the data delta;
determining if a compression ratio of the compressed data delta is within a predetermined tolerance threshold,
if the compression ratio is within the predetermined tolerance threshold, transmitting the compressed data delta as a delta data frame across the electronic communication network to the server;
reading additional subsequent data groups;
repeat the calculating, compressing, and determining steps for the additional subsequent data groups; and
if the compression ratio is not within the predetermined tolerance threshold, compressing the first subsequent data group, transmitting the compressed first subsequent data group as an updated reference frame across the electronic communication network to the server.

18. The system of claim 17, including the electronic communication network formed from a plurality of sensors linked as nodes of the electronic communication network.

19. The system of claim 17 including the codec configured to transmit a variable amount of data delta frames following transmitting a reference frame.

20. The system of claim 17 including a server connected to the electronic communication network, the server including a control processor, a codec configured to decompress data from the sensor, and a web application configured to execute instructions utilizing the decompressed data.

* * * * *